United States Patent [19]
Hamre

[11] Patent Number: 5,481,563
[45] Date of Patent: Jan. 2, 1996

[54] JITTER MEASUREMENT USING A STATISTICALLY LOCKED LOOP

[75] Inventor: John D. Hamre, Plymouth, Minn.

[73] Assignee: Network Systems Corporation, Minneapolis, Minn.

[21] Appl. No.: 212,216

[22] Filed: Mar. 14, 1994

[51] Int. Cl.⁶ .................. H04L 7/00; H04B 3/46
[52] U.S. Cl. .................. 375/226; 375/371; 375/376; 375/374; 375/359; 375/355
[58] Field of Search ................ 375/371, 376, 375/373–375, 362, 359, 354, 355, 226; 370/105.3, 108

[56] References Cited

U.S. PATENT DOCUMENTS

| | | |
|---|---|---|
| 3,771,059 | 11/1973 | Butler et al. . |
| 4,757,452 | 7/1988 | Scott et al. . |
| 4,942,593 | 7/1990 | Whiteside et al. . |
| 4,974,234 | 11/1990 | Brandt ................ 375/226 |
| 4,985,900 | 1/1991 | Rhind et al. . |
| 5,103,466 | 4/1992 | Bazes . |
| 5,121,342 | 6/1992 | Szymborski et al. . |

Primary Examiner—Stephen Chin
Assistant Examiner—Hai H. Phan
Attorney, Agent, or Firm—Haugen and Nikolai

[57] ABSTRACT

A jitter measurement system for a serial digital data link includes a clock recovery element effective to separate a clock signal from the digital data bits being transmitted. The clock signal is applied first to a programmable delay element whose output is applied to as a first input to a decision circuit. The second input to the decision is the serial data stream. The relation of the data to the clock is initially set so that the clock is sampling the data at approximately the transition point of the data. Depending on the exact location of the data relative to the clock signal, the result of the sampling process will yield one of two results. First, if the data transition occurs before the clock transition, no error results. However, if the clock transition occurs before the data transition, an error results. An error ratio detector circuit determines an error ratio which is compared to a predetermined reference. If the reference is exceeded by error ratio, the delay of the programmable delay circuit is adjusted in a closed loop fashion to make the error ratio correspond to the predetermined allowable error rate.

6 Claims, 3 Drawing Sheets

JITTER MEASUREMENT USING A STATISTICALLY LOCKED LOOP

BACKGROUND OF THE INVENTION

I. Field of the Invention

This invention relates generally to apparatus for measuring the jitter present at the transitions of a data stream, and more particularly to a jitter measurement circuit operative at gigabit per second data rates.

II. Discussion of the Prior Art

Many forms of digital communications rely upon serial data communications technology. Various modulation schemes have been devised to encode data into a bit-serial format, allowing it to be conveyed over a single electrical conductor or optical fiber. Such schemes must necessarily be self-clocking, i.e. the clock signal required to interpret the received bit-serial signal must, itself, be a discernable component of the signal. It is well known in the art to employ phased-locked loops or surface acoustic wave (SAW) devices to first recover the clock signal from the bit-serial data stream and then use the recovered clock signal to sample (strobe) the bit-serial signal to thereby determine the bit-by-bit information state of the received signal. Ideally, the recovered clock is adjusted in phase such that the active clock transition occurs midway between data transitions because it is here that the data has the highest probability of being stable and correct. In practical systems, there are many random and systematic perturbations which corrupt the signal to cause the timing relationship between the recovered clock and the transition of data to vary from the ideal. This variation is commonly known as "jitter".

A means to accurately measure jitter is important since this is one of the most important parameters for assessing the performance of a serial data link. Jitter determines the maximum signaling rate and error rate of the data link. A measurement of jitter may also be useful as a diagnostic tool to isolate existing faults in the data link or to sense degradation of the data link so that corrective maintenance for an impending failure can be accomplished. For maximum utility, particularly in the prediction of future error rate, the jitter measurement apparatus should fully characterize the distribution of jitter, i.e., the probability of error occurrence as a function of jitter magnitude. Hereafter this distribution will be referred to as the jitter profile.

The importance of this parameter has inspired many prior art schemes for jitter measurement apparatus. Typical prior art schemes involve a direct measurement of the jitter, i.e., the apparatus derives the jitter measurement by observing the actual time relationship between data transitions and clock transitions. Certain of these schemes combine a set of direct jitter measurements in a manner which generates information somewhat indicative of the jitter profile. For example, U.S. Pat. No. 3,771,059 to Jaquith Gould Butler teaches a circuit which produces a result indicative of both the peak and the RMS values of jitter. U.S. Pat. No. 5,220,581 to Frank D. Ferraiolo teaches a circuit which effectively sorts jitter measurements into bins to form a jitter histogram. The Ferraiolo technique provides more useful jitter information than Butler, but with the penalty of greater complexity. A low number of bins compromises the measurement accuracy while a large number of bins increases complexity and cost. Further, neither of these prior art schemes is useable for very high speed data links. Very high speed data links, such as the Network Systems Communications PS 32 Serial HIPPI interface board, operate near the propagation delay limits of the fastest logic circuitry currently available. The implementation of jitter measurement apparatus which subdivides the basic clock cycle in the manner taught by Ferraiolo would require logic circuits substantially faster than those used to implement the data link itself.

SUMMARY OF THE INVENTION

The instant invention provides a relatively simple jitter measurement system which can very accurately determine the jitter profile of a digital data link. It is particularly suitable for very high speed data links, since its implementation doesn't impose logic speed (propagation delay rise and fall times) requirements exceeding those required for the data link which is the subject of the measurement. The advantages of simplicity and speed are achieved by devising a statistically locked loop which measures jitter by an indirect statistically-based method. Whereas, the prior art may be characterized as asking the question: "What is the magnitude of the jitter?"; the instant invention asks the question: "What is the peak value of jitter for a specified fraction of data transitions?". Specifically, the invention compares the number of transitions occurring on a data stream with the number of data transitions that exceed a statistically defined location in time relative to a recovered serial clock. When a transition exceeds this location in time, i.e., is earlier, the result is defined as an induced error. The term "induced error" is used to clearly distinguish this condition from other errors which may arise in normal operation of the data link. The ratio of induced errors to data transitions is compared to a predetermined reference value and the result of the comparison is used in a feedback loop. The result of this comparison continually adjusts the delay of the recovered serial clock until the decision circuit generates an induced error rate corresponding to the predetermined reference error rate. The term "statistically locked loop" will be used to describe this type of control loop.

A jitter profile is generated by varying the reference error-rate in a step-wise manner and observing the corresponding change in the programmable delay due to the operation of the statistically-locked loop. In contrast to the prior art, a particular embodiment of the invention does not inherently limit the accuracy of the measurement. The granularity of the measurement is determined solely by the choice of step size for the manipulation of the error rate reference rather than the number of explicit measurement bins designed into the measurement apparatus.

The present invention thus comprises an apparatus for determining the jitter profile of a serial data link that employs a self-clocking data signal. The apparatus includes a clock recovery means for generating a recovered clock signal and a recovered data signal from the self-clocking data signal. The recovered clock signal is used to establish a first sampling time for sampling the self-clocking data signal. A programmable delay means establishes a second sampling time to sample the self-clocking data signal and the resulting interval between the first and second sampling times are a function of a delay value signal applied to the programmable delay means. Also included in the jitter profile measuring apparatus is a first circuit means for producing an induced error signal indicative of a difference of results when sampling the self-clocking data signal at the first sampling time and then at the second sampling time. A further circuit means is arranged to produce an error ratio signal indicative of the number or count of induced error signals within a defined interval. The error ratio signal is then compared with a predetermined error ratio value with the results of the comparison being used to control the delay value of the programmable delay means whereby the error ratio signal made to substantially correspond to the adjustable reference signal.

OBJECTS OF THE INVENTION

It is a principal object of the invention to provide a jitter measurement apparatus which can fully and accurately characterize the jitter profile of a digital data link.

It is a further object of the invention to accomplish the measurement of jitter in a way that is most advantageous for the prediction of error rate.

It is another object of the invention to measure the distribution of jitter with a method which can be implemented with relative simplicity.

It is a still further object of the invention to provide a jitter measurement method that can be used with very high speed data links.

DESCRIPTION OF THE DRAWINGS

The foregoing features, objects and advantages of the invention will become apparent to those skilled in the art from the following detailed description of a preferred embodiment thereof, especially when considered in conjunction with the accompanying drawings in which like numerals in the several views refer to corresponding parts.

DETAILED DESCRIPTION

Figure 1A:
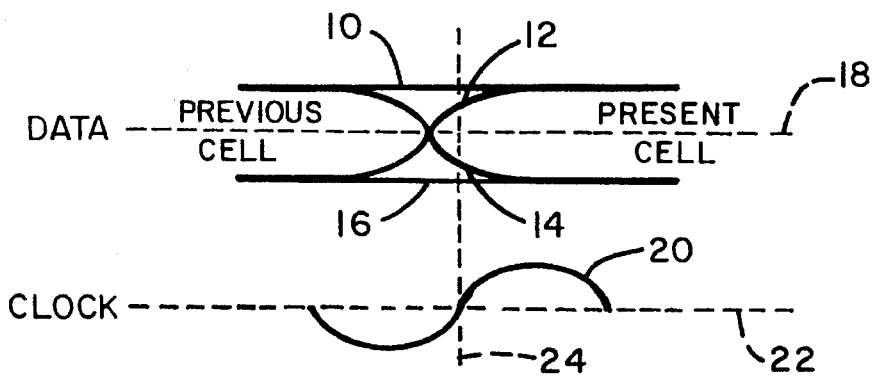
FIGS. 1(a) and 1(b) shows the timing relationship of clock and data signals for a typical data link.
Figure 1B:
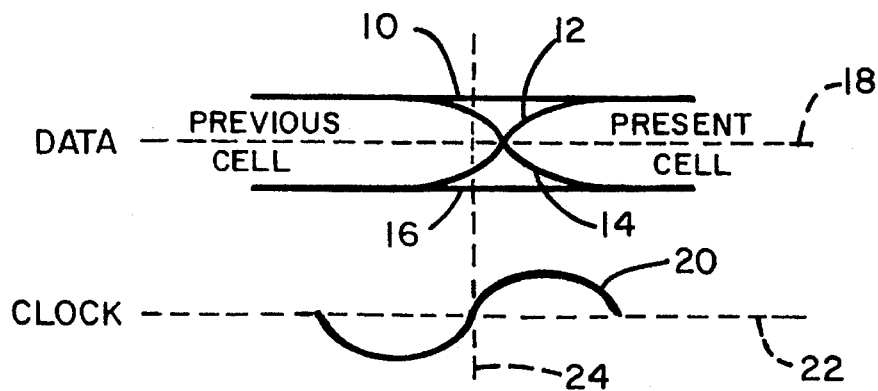

FIGS. 1(a) and 1(b) show the waveforms typical of self-clocking signals. With reference first to FIG. 1(a), the upper waveform illustrates typical data transitions. Traces 12 and 14 are representative of the data transitions zero-to-one and one-to-zero, respectively. Traces 10 and 16 are representative of instances of no data transition, i.e., consecutive ones or consecutive zeros. Line 18 indicates the quantizing threshold for the data signal. The lower waveform of FIG. 1(a) shows the recovered clock signal 20 with respect to its quantizing threshold 22. The vertical line 24 thus indicates the time that the leading edge of the clock signal crosses the threshold to sample the data signal. FIG. 1(a) shows a non-error condition, i.e., the data is sampled within the present cell where the data is valid. FIG. 1(b) shows an error condition wherein the data transitions occur after the leading edge of the clock causing an output which reflects the state of the previous cell rather than the present cell.

Figure 2:
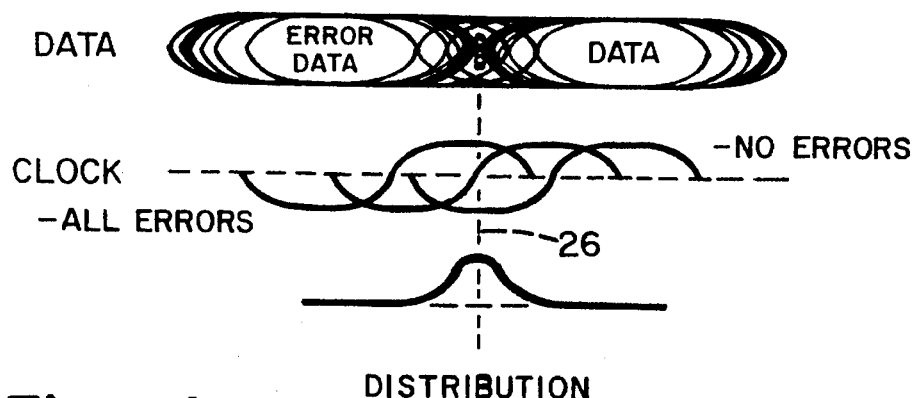
FIG. 2 is illustrative of the jitter present in the data of a practical (actual) data link.

Referring now to FIG. 2, the upper waveform shows a typical "cat's eye" jitter pattern which is the superposition of multiple data transitions with a horizontal displacement indicative of the degree of jitter which may be observed in an actual data link. As before, the window to the right of vertical line 26 is the present cell and a leading clock edge in this window yields correct data. The middle waveform of FIG. 2 shows the range over which the clock timing varies to encompass all possibilities between an all-error condition and a no-error condition. Note that for the no-error condition, the leading edge of the clock occurs after the last data transition and for the all-error condition, the leading edge of the clock occurs before the first transition. If the distribution of jitter is assumed to be normal, then the 50 percent error condition would occur when the leading edge of the clock is aligned with the nominal time of data transition indicated by vertical line 26. The lower trace in FIG. 2 is indicative of the jitter profile, i.e., it is the probability density function, or distribution, of the actual time of data transition. The integration of the probability density function yields the cumulative distribution which is another way of representing the jitter profile. The cumulative distribution is typically an "S"-shaped function (or mirror image S in this case) which varies from zero to one indicating the fraction of errors induced by the corresponding clock timing.

The instant invention determines the jitter profile by effectively measuring the cumulative distribution function. From this data, the probability density function may be mathematically derived, if desired. The cumulative distribution of jitter assumes that the probability of error is the dependent variable and that time (clock delay) is the independent variable. In the operation of the invention, however, this relationship is reversed. The invention employs a statistically-locked loop to establish the delay which induces a specified fraction of errors to occur. Each transition in the data (zero to one or one to zero) is an opportunity for the statistically-lock loop to detect an induced error. Each cell of the data signal is sampled twice. It is first sampled with an adjustable early clock, then with the nominal clock which is centered in the present cell and presumed to yield correct data. When there is a data transition, the two results will be identical only if both clocks are after the data transition. A data transition causing different results indicates that the early clock has preceded the data transition and has thus sampled the state of the previous cell. The measurement of the number of such induced errors for a specified number of data transitions establishes the fraction of data transitions which have sufficient jitter to induce an error. The statistically-locked loop adjusts the delay of the early clock to a value where the measured error rate substantially equals a reference value.

Figure 3:
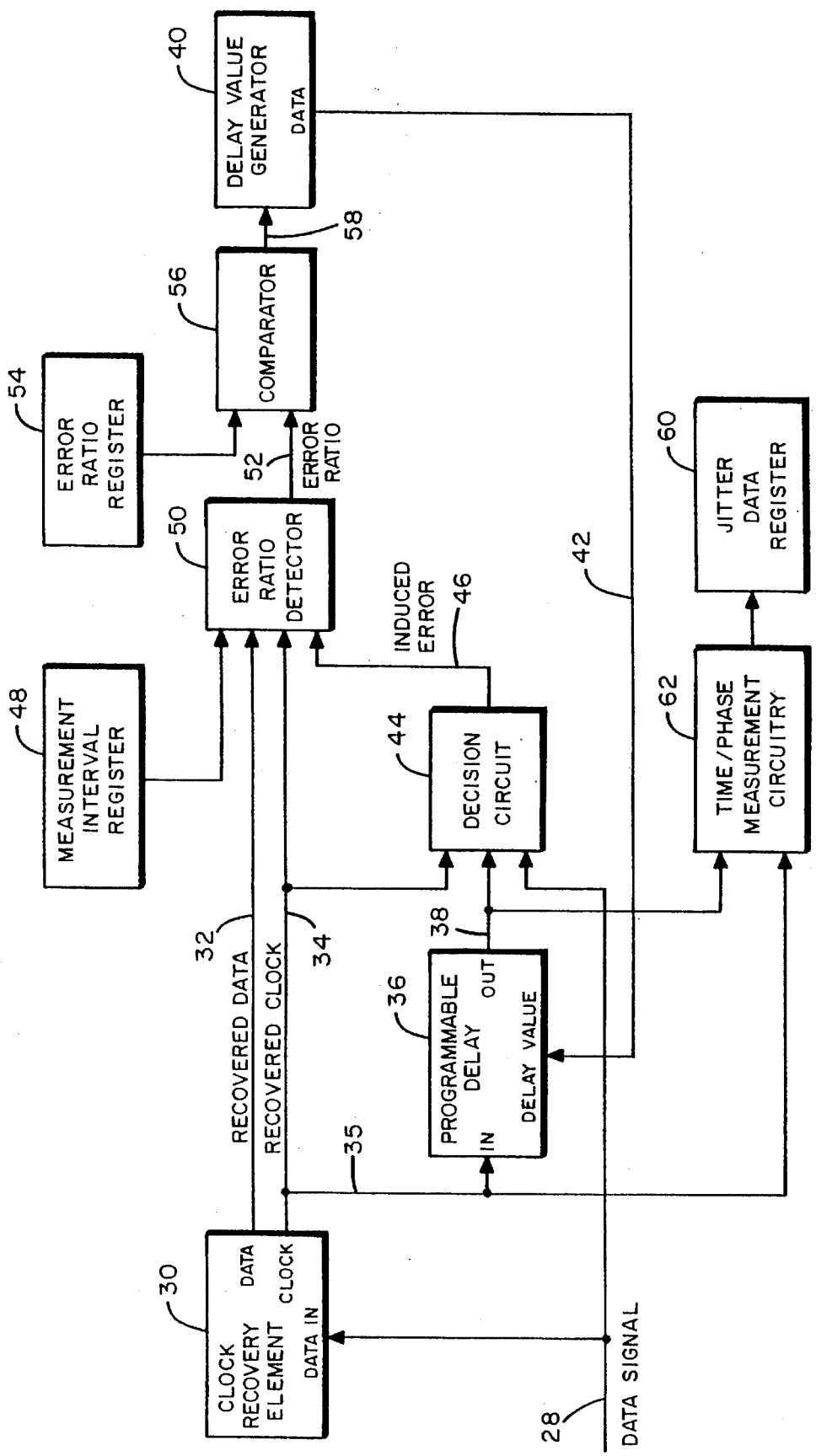
FIG. 3 is a system block diagram illustrative of an embodiment of the invention.

FIG. 3 shows a system block diagram illustrative of the invention. The data signal applied to line 28 is a typical self-clocking serial data signal. Clock recovery element 30 is a typical prior art circuit which recovers the original components of the signal, i.e., recovered data on line 32 and recovered clock on line 34. The recovered data signal is the result of sampling the input data signal or train on line 28 with the recovered clock signal on line 34 and is, thus, the nominal time sample. The recovered clock signal is applied, via line 35, to a programmable delay 36 which operates to produce a time adjusted (early) clock signal on line 38. The value of this delay is provided by delay value generator 40, via line 42. Decision circuit 44 employs the clock signal on line 34 to derive the early sample of the data signals on line 28 and compares this result with the nominal time samples (recovered data on line 32). Induced error signal emanating from decision circuit 44 on line 46 provides a cell-by-cell indication of a difference. Measurement interval register 48 determines the number of data transitions which comprise a measurement interval. Error ratio detector 50 produces an error ratio signal on line 52 indicative of the fraction of data transitions comprising a measurement interval which are in error per the decision circuit criteria, i.e., a data transition occurring between the time adjusted (early) clock and the recovered (nominal) clock. Error ratio register 54 provides a predetermined reference value of error rate for the statistically-locked loop to comparator 56 which, in turn, provides a control signal on line 58 based upon the comparison of the reference error rate and the measured induced error rate. Delay value generator 40 incrementally adjusts the delay value for programmable delay circuit 36 in response to the control signal on line 58. Data path 42 provides the dynamically adjusted delay value to programmable delay 36 to close the loop. The loop operates iteratively to establish a value of delay that induces an error rate substantially equal to the reference error rate.

If the accuracy of the programmable delay is sufficient, the output of the delay value generator is itself a sufficient indication of jitter and may be directly used as an input to jitter data register 60. It is also contemplated that in certain applications a more accurate result may be obtained by employing well known time/phase measurement circuitry 62 to instead measure the delay.

Preferably, measurement interval register 48, error ratio register 54, and jitter data register 60 are digital registers which may be written to and interrogated by a digital computer. The computer is programmed to perform a stepwise manipulation of the error ratio register and retrieve results from the jitter data register to assemble the jitter profile. The computer may additionally process the data and communicate it in a variety of well known ways. In an alternative embodiment, the measurement interval register 48 and the error ratio register 54 may be manually operable means, such as DIP switches or the like and the jitter data register may be an observable display device.

With continued reference to FIG. 3, the system may be calibrated by incorporating a programmable delay in the data signal line 28 leading to decision circuit 44 and setting the probability value to 50%. Then by varying the added delay until the output of the time/phase measurement circuitry 62 reads zero, the system is in proper calibration.

Figure 4:
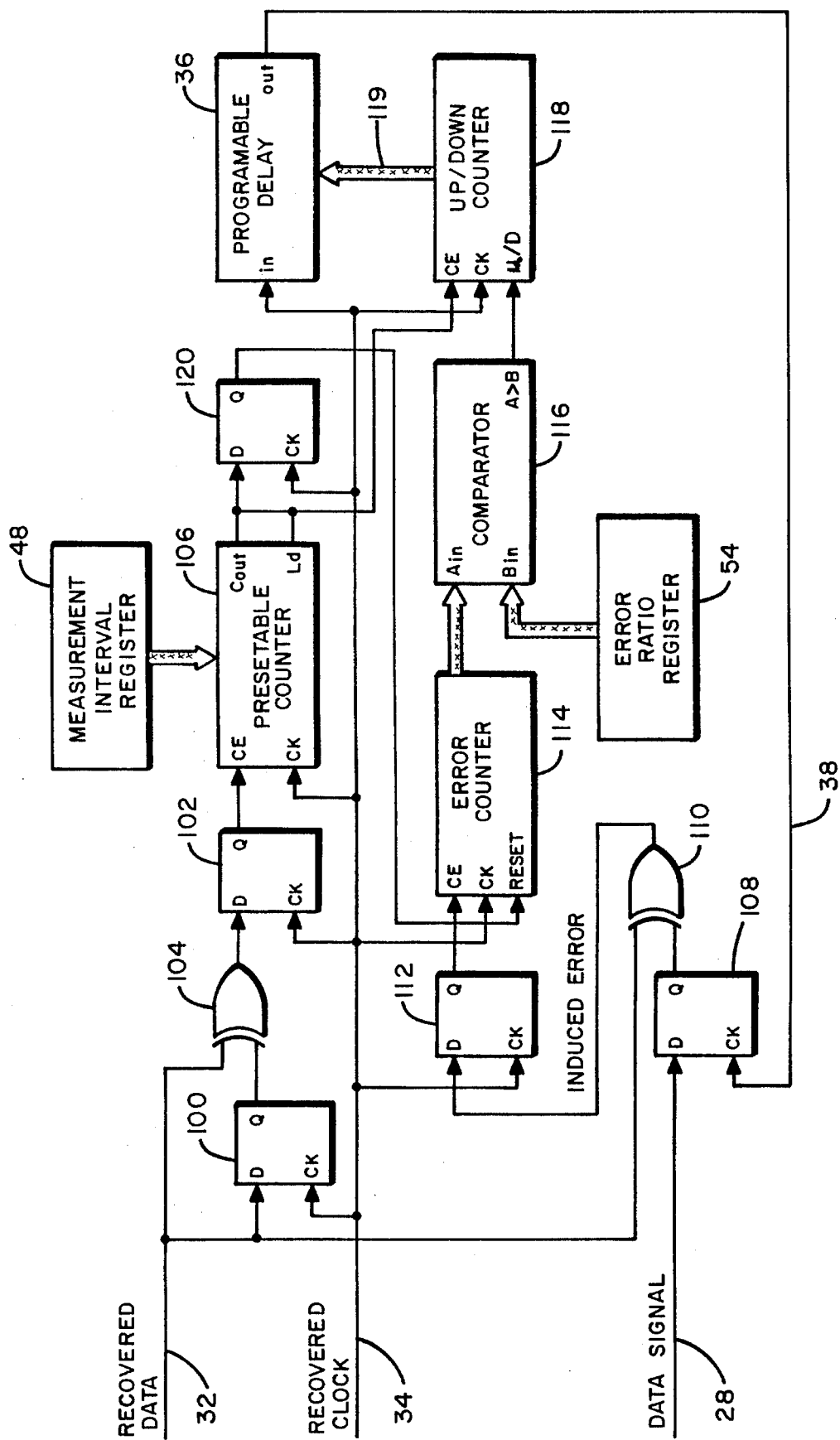
FIG. 4 is a more detailed block diagram illustrative of a preferred embodiment of the statistically-locked loop.

FIG. 4 is a more detailed circuit diagram of a preferred embodiment of the statistically-locked loop in accordance with the present invention. The detection of data transitions in the recovered data signal on line 32 is accomplished by D-type flip flops 100, 102 and Exclusive-OR gate 104. A zero-to-one or a one-to-zero transition in the recovered data activates the count enable (CE) input of a presettable down counter 106. Thus, counter 106 is decremented for each data transition until it reaches zero, the end of a measurement interval. The transition through zero generates a carry out (Cout) signal which activates the load (Ld) input to preset counter 106 to the value contained in measurement interval register 48 and thus respectively initiates a new measurement interval.

Flip flop 108 and Exclusive-OR gate 110 correspond to the decision circuit 44 of FIG. 3. If the state of a data signal on line 28 at the time it is sampled by the delayed clock signal 38 is different than the state of the recovered data signal on line 32, the output of Exclusive-OR gate 110 will be a logical one, indicating an induced error. The next leading edge of recovered clock signal on line 34 latches the error state into flip flop 112, thus enabling the count enable (CE) input of error counter 114, such that counter 114 will be incremented on the subsequent recovered clock cycle. In this manner counter 114 accumulates the number of errors induced during a given measurement interval.

The outputs of error counter 114 are provided to the A inputs of digital comparator 116 while the outputs of error ratio register 54 are connected to the B inputs. Whenever the value of the error counter exceeds the value of the error ratio register, the output of the comparator is a logical one. At the end of each measurement interval the "carry out" output of presettable counter 106 activates the count enable (CE) of counter 118 for one cycle of the recovered clock. If the accumulated error count is greater than the value of the error ratio, counter 118 is incremented. Otherwise, counter 118 is decremented. Incrementing counter 118 causes a greater delay value to be presented to the programmable delay, via data path 119. Increasing the value of the programmable delay actually decreases the phase difference between the recovered clock and the delayed clock (a delay of exactly one clock period yields a zero phase difference). This is the negative feedback required for closed loop operation since the probability of induced error decreases as the phase difference between clocks decreases. The carry-out signal (C.O.) from counter 106 also latches D-type flip-flop 120 for one clock cycle to thereby reset error counter 114 and thus begin an accumulation of induced error counts for the new measurement interval.

The disclosed embodiments may be implemented with circuit technology that need be no faster than the circuit technology used to implement the clock recovery element 30 (FIG. 3). The invention is thus useable with the highest speed data links which are at any time feasible. The Motorola ECLinPS (emitter coupled logic in picoseconds) family of logic circuits is illustrative of the circuit technology currently used in the highest speed clock recovery circuits of high speed data links and which would also be sufficiently fast for the invention to be used in conjunction with those data links. With no limitation intended, the programmable delay 36 may be implemented with a dynamically programmed timing edge vernier, such as the type MC10E195 or MC10E196 manufactured by Motorola Corporation of Phoenix, Ariz.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. An apparatus for determining the jitter profile of a serial data link employing a self-clocking data signal, said apparatus comprising:

clock recovery means coupled to receive the self-clocking data signal for generating a recovered clock signal and a recovered data signal in response to said self-clocking data signal, said recovered clock signal establishing a first time to sample said self-clocking data signal;

programmable delay means coupled to receive the recovered clock signal for establishing a second time to sample said self-clocking data signal, the interval between said first and said second sampling times being a function of a delay value signal input to said programmable delay means;

first circuit means operatively connected to an output of the clock recovery means and the programmable delay means for producing an induced error signal at an output indicative of a difference of results when sampling said self-clocking data signal at said first sampling time and then at said second sampling time;

second circuit means coupled to the output of the first circuit means for producing an error ratio signal indicative of the number of said induced error signals occurring within a predetermined measurement interval;

third circuit means including means for comparing said error ratio to a predetermined error ratio reference signal, the third circuit means producing said delay value signal in response to a difference between said error ratio signal and said predetermined error ratio reference signal; and said apparatus operating iteratively in a closed-loop manner to control said delay value signal such that said error ratio signal substantially corresponds to said predetermined error ratio reference signal.

2. The apparatus of claim 1 wherein the third circuit means comprises:

an error ratio register for providing said predetermined error ratio reference signal;

a comparator for producing an output indicative of the relative magnitude of said predetermined error ratio reference signal in relation to said error ratio signal; and a bi-directional counter connected to receive the recovered clock signal and periodically responsive to said comparator output to increment a count of the recovered clock signals when said error ratio signal is greater than said predetermined error ratio reference signal and to decrement the count of the recovered clock signals when said error ratio signal is less than said predetermined error ratio reference signal.

3. The apparatus of claim 1 wherein the second circuit means comprises:

a measurement interval register for defining the number of data transitions in said self-clocking data signal which are to comprise a measurement interval;

a presettable counter coupled to said measurement interval register for determining a beginning and an end of said measurement interval; and an error counter which is reset at the beginning and the end of said measurement interval and which is incremented by the recovered clock signals in response to said induced error signal.

4. The apparatus as in claim 1 and further including means coupled to receive an input to and an output from said programmable delay means for measuring said interval between said first and second sampling times.

5. A method for measuring the probability of error occurrence in the demodulation of a self-clocked serial data stream as a function of jitter magnitude comprising the steps of:

applying said self-clocked serial data stream to a clock recovery circuit to generate a recovered clock signal and a recovered data signal;

using said recovered clock signal to establish a first time to sample said self-clocked serial data stream;

providing a programmable delay means that is responsive to the recovered clock signal for establishing a second time to sample said self-clocked serial data stream where the interval between the first and second sampling times is proportional to a delay value signal applied to the programmable delay means;

generating an induced error signal proportional to a difference of results when sampling the self-clocked serial data stream at the first and then at the second sampling time;

determining an error ratio as the ratio of the induced error signal to the number of data transitions in a predetermined measurement interval;

comparing the error ratio to a predetermined error ratio reference value and generating a delay value signal proportional to a difference between the error ratio and the predetermined error ratio reference value; and applying the delay value signal to the programmable delay means for reducing the difference to zero.

6. The method as in claim 5 and further including the step of:

measuring the time interval between said first and second sampling times; and storing the measured time interval value as an indication of jitter magnitude.

* * * * *